United States Patent
Mezer et al.

(10) Patent No.: US 7,492,292 B2
(45) Date of Patent: Feb. 17, 2009

(54) CALIBRATING AN ANALOG COMPONENT USING DIGITAL FEEDBACK INFORMATION

(75) Inventors: Amir Mezer, Haifa (IL); Alon Meisler, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/807,454

(22) Filed: May 29, 2007

(65) Prior Publication Data

US 2008/0297383 A1 Dec. 4, 2008

(51) Int. Cl.
*H03M 1/06* (2006.01)
(52) U.S. Cl. .................. 341/118; 341/155; 341/161; 375/316
(58) Field of Classification Search .......... 341/118, 341/155
See application file for complete search history.

(56) References Cited

U.S. PATENT DOCUMENTS

| | | | |
|---|---|---|---|
| 6,980,140 B1* | 12/2005 | Rowland et al. | 341/118 |
| 7,091,894 B2* | 8/2006 | Fudge et al. | 341/155 |
| 7,139,332 B2* | 11/2006 | Yu et al. | 375/316 |
| 7,268,720 B1* | 9/2007 | Murden | 341/161 |
| 7,330,140 B2* | 2/2008 | Balakrishnan et al. | 341/118 |
| 7,336,729 B2* | 2/2008 | Agazzi | 375/316 |
| 2005/0276225 A1 | 12/2005 | Mezer | 370/241 |

OTHER PUBLICATIONS

Yun Chiu, et al., "Least Mean Square Adaptive Digital Background Calibration Of Pipelined Analog-To-Digital Converters," Jan. 2004, pp. 38-46.
U.S. Appl. No. 11/394,925, filed Mar. 31, 2006, entitled "Techniques To Converge And Adapt A Communication System Receiver," by Amir Mezer, et al.
U.S. Appl. No. 11/551,069, filed Oct. 19, 2006, entitled "Techniques To Reduce The Impact Of Jitter On Communications System Performance," by Ehud Shoor.

* cited by examiner

*Primary Examiner*—Khai M Nguyen
(74) *Attorney, Agent, or Firm*—Trop, Pruner & Hu, P.C.

(57) ABSTRACT

In one embodiment, the present invention includes an apparatus having an analog front end to receive a signal from a communication channel physical medium, an analog-to-digital converter (ADC) coupled to an output of the analog front end to digitize the received signal, and a digital signal processor (DSP) coupled to receive an output signal of the ADC and to process the digitized signal to generate a decision output and an error signal, and a feedback path to provide the error signal from the DSP to the ADC for use in calibration. Other embodiments are described and claimed.

8 Claims, 4 Drawing Sheets

CALIBRATING AN ANALOG COMPONENT USING DIGITAL FEEDBACK INFORMATION

BACKGROUND

In a receiver of a communication system, it is common to include an analog-to-digital converter (ADC) and a digital signal processor (DSP). At the output of the DSP, there exists a slicing (decision) mechanism where remote transmitted symbols are estimated. At the slicer output, the decision (estimated remote symbols) and an error are obtained. The error is typically obtained by subtracting the slicer output (i.e., a hard decision) from its input (i.e., a soft decision).

Each analog circuit at a front end of the receiver, specifically, but not only, the ADC, is allowed to add a limited amount of noise to the system. The ADC requirements usually include a metric known as the effective number of bits (ENOB), which describes the quality of the ADC.

Since it is common practice to define the required performance for each system component by itself, a designer of each system component may add tuning or calibration mechanisms to allow adjustments until requirements defined by the system designer are met. These mechanisms are traditionally built for each component separately. However, such mechanisms are costly, complex, and not suited for use during system operation.

DETAILED DESCRIPTION

In various embodiments, a feedback path may be provided from digital circuitry of a receiver such as a digital signal processor (DSP) to analog front end circuitry. More specifically, error information generated by the DSP may be provided to the analog circuitry and used for purposes of compensating one or more analog components within the circuitry. In this way, mismatches present in the analog circuitry may be compensated, providing for improved performance. While the scope of the present invention is not limited in this regard, in some implementations tuning of an analog circuit may be performed by taking advantage of a correlation between the error signal generated in the DSP and a mismatch error that is introduced into the receiver by the analog circuitry.

Figure 1:
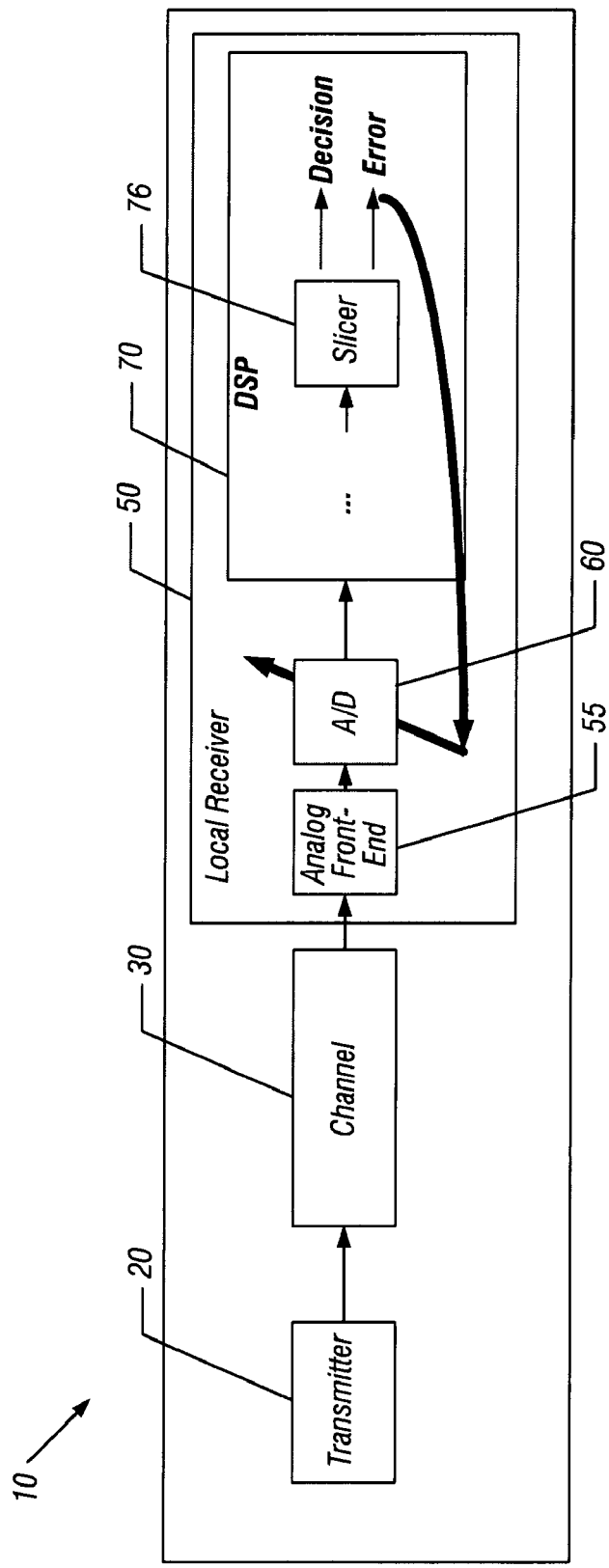
FIG. 1 is a block diagram of a portion in a system in accordance with an embodiment of the present invention.

Referring now to FIG. 1, shown is a block diagram of a portion in a system in accordance with an embodiment of the present invention. As shown in FIG. 1, system 10 may be a portion of a communication system in which a first system that includes a network interface having a transmitter 20 is coupled through a communication channel 30 to a second system including a network interface having a local receiver 50. Transmitter 20 may be a transmitter of a physical (PHY) unit that in turn is coupled to a media access control (MAC) unit of the first system (not shown in FIG. 1). In various embodiments, channel 30 may be a physical medium that may be, for example, a standard cable such as a gigabit Ethernet cable.

Similarly, receiver 50 may be a portion of a PHY unit of the second system. These network interfaces of the first and second systems may represent any network interface suitable for use with a number of different Ethernet techniques such as in accordance with an Institute of Electrical and Electronics Engineers (IEEE) for its so-called 10GBase-T standard, i.e., Draft Amendment P802.3an/Draft 3.1, 2005, or other digital communication protocol such as an asynchronous digital subscriber line (ADSL) protocol, although the scope of the present invention is not limited in this regard. During communication between these systems, various channel impairments such as near-end and far-end echo and cross-talk may occur, as well as other channel impairments such as signal attenuation due to characteristics of the physical medium.

As shown in FIG. 1, receiver 50 may include an analog front end 55 that is coupled to receive incoming signals from channel 30. Analog front end 55 may perform various processing such as gain control and so forth to receive incoming signals from channel 30 and provide an analog output to an analog-to-digital converter (ADC) 60, which may be a controllable ADC that receives the incoming analog information in the form of a voltage and provides a digital output to a digital signal processor (DSP) 70. Various controllable ADCs may be used for ADC 60. For example, an architecture having a monotonic transfer function with limited performance capabilities may be used. Other embodiments may be implemented in a system including a pipelined ADC architecture such as a time-interleaved pipelined ADC. Such ADCs may include compensation circuitry (e.g., digital compensation circuitry) to compensate or tune the ADC based on its operating environment.

Still referring to FIG. 1, DSP 70 includes various components depending on a given system in which it is included. For example, DSP 70 may include an equalizer, e.g., a high pass filter (HPF) such as a finite impulse response (FIR) filter to perform adaptive feed forward equalization (FFE) in order to remove or reduce inter-symbol interference (ISI). Other components within DSP 70 may include echo cancellers or other signal processing components to improve signal integrity of a signal received having various channel impairments. The processed incoming signal may be provided to a slicer 76, which may generate a decision symbol and a slicer error signal as outputs therefrom. The decision symbol may reflect a filtered and/or equalized version of the equalized input signal and may include data to be recovered from the signal received from channel 30. In turn, the error signal may be an error signal to indicate a deviation of the equalizer input signal from a predetermined signal profile for the received input signal. While not shown in the embodiment of FIG. 1, it is to be understood that both of these output signals from DSP 70 may be provided to further signal processing circuitry, such as decoding, framing or other circuitry, and on to a MAC unit, for example.

As shown in FIG. 1, in various embodiments digital information, namely slicer error information output from slicer 76 may be fed back to analog circuitry, for example, ADC 60 to be used for tuning/calibrating this analog circuitry. In this way, the correlation between the slicer error and a mismatch error which has been introduced into the signal output from ADC 60 may be leveraged. In various embodiments, the error information may be provided to digital circuitry within ADC 60 to perform adaptive compensation of the various stages of ADC 60 using various adaptive techniques, such as a least mean square (LMS) algorithm or in another such manner.

In this way, a relatively low quality ADC may be provided and compensated to improve performance while maintaining reduced power consumption (and reduced die space). Accordingly, the need for additional calibration mechanisms such as external digital-to-analog converters (DACs), additional parallel ADCs or other components used to obtain information regarding ADC mismatch and adjust calibration filters may be avoided.

Note that calibration in accordance with an embodiment of the present invention may be performed during system start up as well as during operation, to allow the ADC to adapt to changes of analog circuit mismatches over time due to temperature change, power supply changes and so forth.

Figure 2:
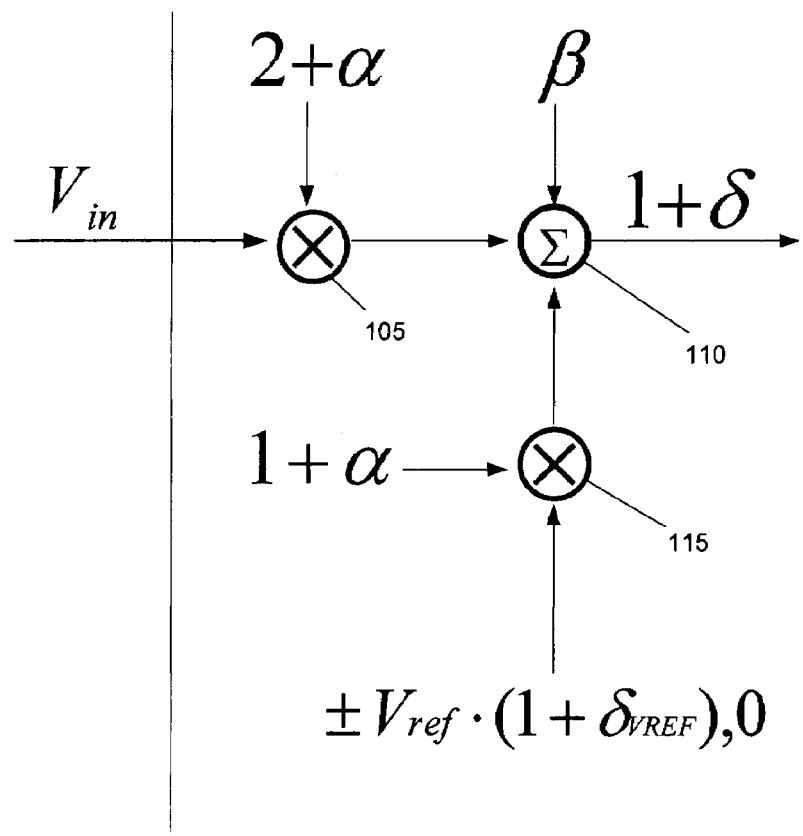
FIG. 2 is a block diagram of a model of a non-ideal analog-to-digital converter (ADC) in accordance with an embodiment of the present invention.

Referring now to FIG. 2, shown is a block diagram of a model of a non-ideal ADC stage that may be present in embodiments of the present invention. As shown in FIG. 2, ADC stage 100 may be modeled as including a first multiplier 105, a summer 110 and a second multiplier 115. The resolution of this non-ideal A/D stage for an input signal, $V_{in}$, may be as follows:

$$V_{res} = (1+\delta)\{(2+\alpha) \cdot V_{in} + \beta + (V_{ref}(1+\delta_{VREF}) \cdot (1+\alpha), -V_{ref}(1+\delta_{VREF}) \cdot (1+\alpha), 0)\}$$

where $\alpha$ equals a coefficient error due to capacitor mismatch in accordance with the following equation:

$$\alpha = \frac{(C_f - C_s)}{(C_f + C_s)}$$

where $C_f$ and $C_s$ equal capacitor values; $\beta$ equals operational amplifier offset; $\delta$ equals operational amplifier gain offset; and $\delta_{VREF}$ equals a reference voltage ($V_{ref}$) offset.

Figure 3A:
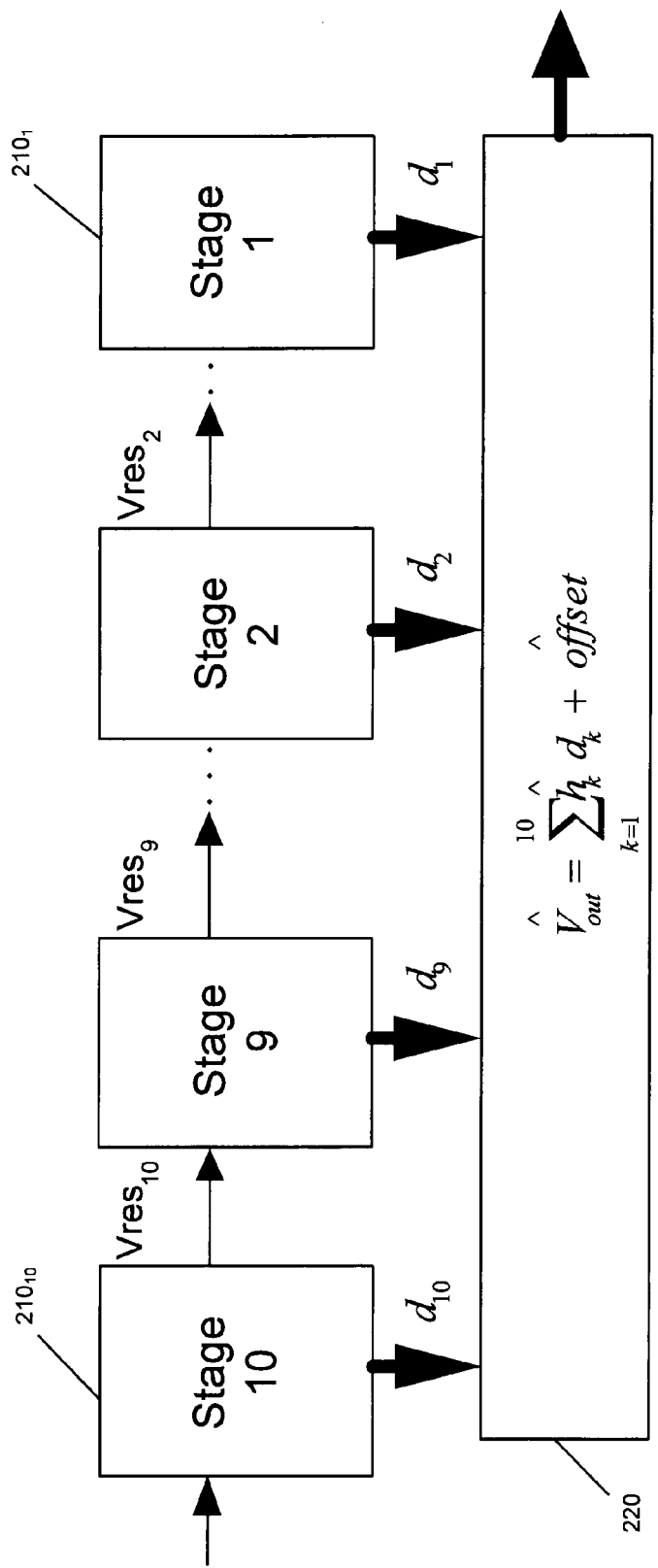
FIG. 3A is a block diagram of a pipelined ADC in accordance with an embodiment of the present invention.

Using multiple non-ideal analog stages, a pipelined A/D may be formed. For example, in some embodiments an ADC used in a receiver, such as ADC 60 of FIG. 1 may take the form shown in the block diagram of FIG. 3A. As shown in FIG. 3A, ADC 200 includes a plurality of stages $210_1$-$210_{10}$ (generically stage 210) coupled to receive an output of the prior stage (or the input voltage into stage $210_{10}$). The decisions of each stage, i.e., $d_{1-10}$ (generically decision d) are provided to a digital compensator 220. Each decision $d_k$ may then be weighted based on values obtained using information from slicer 76 (i.e., the slicer error). As shown in FIG. 3A, digital compensator 220 may be used to provide a compensated output, $$\hat{v}_{out} = \sum_{k=1}^{10} \hat{h}_k d_k + \text{offset},$$

where $\hat{h}$ is a vector of 10 values and offset may be adaptively updated using a LMS algorithm that is provided with information from slicer 76 (of FIG. 1), namely the slicer error signal.

Figure 3C:
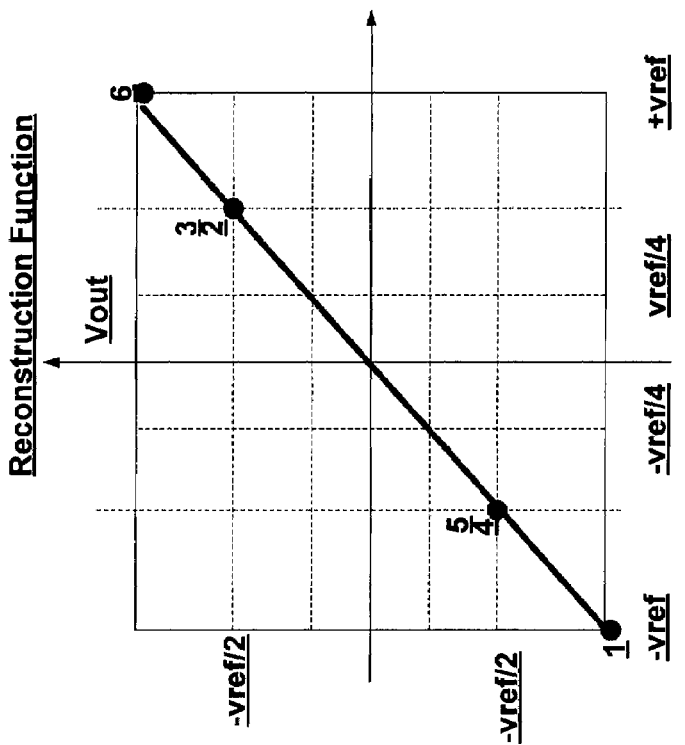
FIG. 3C is a reconstruction function of the transfer function of FIG. 3B.
Figure 3B:
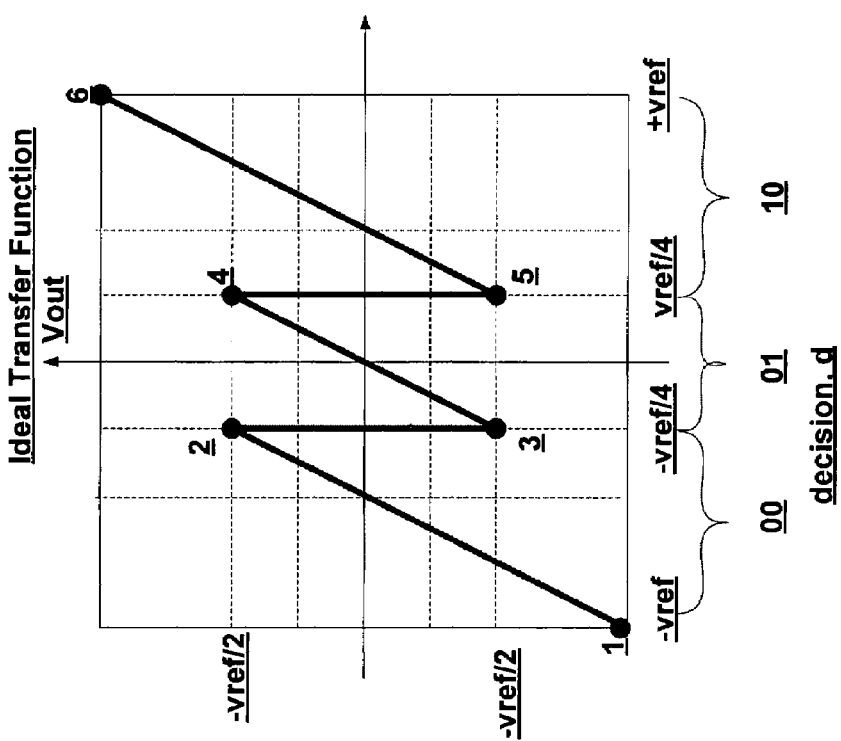
FIG. 3B is an ideal transfer function of a decision of a single pipelined ADC stage in accordance with one embodiment of the present invention.

Referring now to FIG. 3B, shown is an ideal transfer function for a single pipelined ADC stage. More specifically, as shown in FIG. 3B various decisions, d, may be generated based on different voltage values. Referring now to FIG. 3C, shown is a reconstruction function for the ideal transfer function shown in FIG. 3B. As shown in FIG. 3C, a substantially linear function may be realized. More specifically, a reconstruction voltage may take various values based on the decision generated according to the ideal transfer function of FIG. 3B, as follows:

$$V\text{reconstruction} = 2 \cdot V_{in} \rightarrow \text{if } d=01;$$

$$V\text{reconstruction} = 2 \cdot V_{in} + V_{ref} \rightarrow \text{if } d=00;$$

$$V\text{reconstruction} = 2 \cdot V_{in} - V_{ref} \rightarrow \text{if } d=10.$$

In other embodiments, it is possible to adapt using the error directly using other algorithms, such as a normalized LMS, a recursive least-squares (RLS), or any other adaptation algorithm. Still further, the error may also be used indirectly (e.g., averaging, looking at its sign, or passing it through some transformation). In yet other embodiments such as an orthogonal frequency division multiplexing (OFDM) system, the error can be obtained in the frequency domain and transformed into the time domain for adaptation. Note also that it is possible to use either blind adaptation (i.e., perform a decision process at the slicer), or use a known training sequence (i.e., the error is derived by subtracting the equalizer output from a known value of a training sequence symbol).

Using an embodiment of the present invention, a non-ideal pipelined ADC may be compensated and the signal-to-noise ratio (SNR) of a communication system (as seen at an output of a slicer) may be improved via the calibration. For example, in a 10GBaseT system having an ADC with an initial SNR of approximately 7.7 decibels (dB), improved SNR of 27.5 dB may be realized using compensation methods in accordance with an embodiment of the present invention. Furthermore, a transfer function of a calibrated ADC may be improved to provide a substantially linear transfer function. Furthermore, the ENOB may be improved, e.g., from approximately 4 to approximately 11, although the scope of the present invention is not limited in this regard. Similar improvements in a time-interleaved ADC may be realized.

Note that in other embodiments, instead of compensating an ADC, other analog components, such as a DAC or other component may be similarly compensated using digital information, e.g., slicer error signal information. Still further, in addition to Ethernet or ADSL communication systems, embodiments may be implemented in other systems.

Embodiments may be implemented in code and may be stored on a storage medium having stored thereon instructions which can be used to program a system to perform the instructions. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:

an analog front end to receive a signal from a communication channel physical medium;

an analog-to-digital converter (ADC) coupled to an output of the analog front end to digitize the received signal, wherein the ADC is a time-interleaved pipelined ADC having a digital compensator to receive an error signal and to adaptively update a first value and a second value based on the error signal;

a digital signal processor (DSP) coupled to receive an output signal of the ADC to process the digitized signal and to generate a decision output and the error signal, wherein the error signal from the DSP is fed back to the analog front end for use in calibration of an analog circuit, and the output signal corresponds to $$\sum_{k=1}^{N} \hat{h}_k d_k + \text{offset},$$

wherein $\hat{h}_k$ corresponds to the first value corresponding to a vector of N values, offset corresponds to the second value, N corresponds to the number of stages of the ADC, and $d_k$ is a decision output of the $k^{th}$ stage of the ADC that is weighted by the corresponding $\hat{h}_k$, wherein $\hat{h}_k$ and offset are adapted based on the error signal.

2. The apparatus of claim 1, wherein the DSP includes a slicer to generate the decision output and the error signal.

3. The apparatus of claim 1, wherein the digital compensator is to update the first value and the second value using a least mean squared (LMS) algorithm.

4. The apparatus of claim 1, wherein the ADC has a signal-to-noise ratio (SNR) greater than a first amount and an effective number of bits of at least ten bits, wherein the uncompensated ADC has an SNR of a second amount substantially below the first amount and an effective number of bits of less than five bits.

5. A method comprising:
digitizing a received input signal in an analog-to-digital converter (ADC);
outputting the digitized signal to a digital signal processor (DSP);
processing the digitized signal to obtain a decision output and an error output from an error evaluation unit of the DSP;
providing the error output to the ADC along a feedback path coupled between the DSP and the ADC;
adaptively updating a first value and a second value of a compensator of the ADC based on the error output using a least means squared (LMS) algorithm, wherein the digitized signal corresponds to $$\sum_{k=1}^{10} \hat{h}_k d_k + \text{offset},$$

where $d_k$ is a decision output of the $k^{th}$ stage of the ADC, $\hat{h}$ is the first value corresponding to a vector of N values, offset is the second value, and N corresponds to the number of stages of the ADC; and
outputting the digitized signal having a signal-to-noise ratio (SNR) greater than a first amount and an effective number of bits of at least ten bits, wherein the uncompensated ADC has an SNR of a second amount substantially below the first amount and an effective number of bits of less than five bits.

6. The method of claim 5, wherein the error output comprises a slicer error signal that is fed back to the ADC compensator, wherein the ADC compensator comprises a digital compensator.

7. The method of claim 6, further comprising receiving the received input signal from an Ethernet cable and processing the received input signal before digitizing the received input signal.

8. The method of claim 5, further comprising compensating the ADC without information from a parallel ADC.

* * * * *

UNITED STATES PATENT AND TRADEMARK OFFICE
CERTIFICATE OF CORRECTION

PATENT NO. : 7,492,292 B2
APPLICATION NO. : 11/807454
DATED : February 17, 2009
INVENTOR(S) : Amir Mezer and Alon Meisler It is certified that error appears in the above-identified patent and that said Letters Patent is hereby corrected as shown below:

Col. 6:

Line 15, " $\sum_{k=1}^{10} \hat{h}_k d_k + \mathit{offset},$ " should be -- $\sum_{k=1}^{N} \hat{h}_k d_k + \mathit{offset},$ --

Signed and Sealed this
Twenty-third Day of October, 2012

David J. Kappos
*Director of the United States Patent and Trademark Office*